US005978240A

United States Patent [19]

Nicollini

[11] Patent Number: 5,978,240

[45] Date of Patent: Nov. 2, 1999

[54] FULLY DIFFERENTIAL VOLTAGE-CURRENT CONVERTER

[75] Inventor: Germano Nicollini, Piacenza, Italy

[73] Assignee: STMicroelectronics S.r.l., Agrate Brianza, Italy

[21] Appl. No.: 09/166,512

[22] Filed: Oct. 5, 1998

[30] Foreign Application Priority Data

Oct. 7, 1997 [IT] Italy ................................ MI97A2278

[51] Int. Cl.[6] ................................ H02M 7/00; H03F 3/45

[52] U.S. Cl. ................................ 363/73; 330/260

[58] Field of Search ................................ 363/73, 74; 330/260

[56] References Cited

U.S. PATENT DOCUMENTS

| | | | |
|---|---|---|---|
| 5,146,179 | 9/1992 | Carley et al. | 330/253 |
| 5,459,653 | 10/1995 | Seto et al. | 363/73 |
| 5,568,089 | 10/1996 | Maru | 330/253 |
| 5,585,763 | 12/1996 | Navabi et al. | 330/260 |

*Primary Examiner*—Peter S. Wong
*Assistant Examiner*—Bao Q. Vu

[57] ABSTRACT

A fully differential voltage-current converter, comprising a differential operational amplifier which is supplied with a differential voltage to be converted into a current, a first transistor being fedback to a noninverting input of the amplifier, a second transistor being fedback to an inverting input of the amplifier, the second transistor having the opposite polarity with respect to the first transistor, a third transistor and a fourth transistor having mutually opposite polarities being connected between a supply voltage and ground and to the second transistor in order to force a current that flows through the second transistor to be equal to a current that flows through the first transistor, a gate terminal of the first transistor being connected to a gate terminal of the fourth transistor.

7 Claims, 1 Drawing Sheet

FULLY DIFFERENTIAL VOLTAGE-CURRENT CONVERTER

BACKGROUND OF THE INVENTION

The present invention relates to a fully differential voltage-current converter.

Conventional voltage-current converters are considered basic functional blocks in the analog design of integrated and discrete circuits.

Converters of this kind currently convert a single-ended voltage, i.e., an unbalanced voltage, into a current.

An example of this is shown in FIG. 1, wherein the voltage $V_R$ in input to the inverting terminal of the operational amplifier 1 is converted into a current $I_R$.

Since the operational amplifier 1 forces its noninverting input to be equal to its inverting input, i.e., to $V_R$, a current $I_R$ equal to $V_R$/R flows through the resistor R. This current must be supplied by the P-channel MOS transistor 2; therefore, if the MOS transistor 2 is equal to the P-channel MOS transistor 3, the current $I_R$ is mirrored in transistor 3, obtaining current conversion of the input voltage $V_R$.

This type of voltage-to-current conversion is acceptable if the supply voltages are not particularly low and the required performance is not high.

Otherwise, the current trend is to use differential methods, which offer advantages in terms of immunity to supply noise, to noise produced by clock rejection and generally to common-mode noise on the voltages in input to the differential operational amplifier.

SUMMARY OF THE INVENTION

The aim of the present invention is to provide a voltage-current converter of the fully differential type.

Within the scope of this aim, an object of the present invention is to provide a voltage-current converter which can be used with low supply voltages.

Another object of the present invention is to provide a voltage-current converter which by utilizing the differential-type approach maintains all its advantages.

Another object of the present invention is to provide a fully differential voltage-current converter which is a symmetric load for the preceding stage.

Another object of the present invention is to provide a voltage-current converter which is highly reliable and relatively easy to manufacture at competitive costs.

This aim, these objects and others which will become apparent hereinafter are achieved by a fully differential voltage-current converter, characterized in that it comprises a differential operational amplifier which is supplied with a differential voltage to be converted into a current, a first transistor being fedback to a noninverting input of the amplifier, a second transistor being fedback to an inverting input of the amplifier, said second transistor having the opposite polarity with respect to said first transistor, a third transistor and a fourth transistor having mutually opposite polarities being connected between a supply voltage and ground and to said second transistor in order to force a current that flows through said second transistor to be equal to a current that flows through said first transistor, a gate terminal of said first transistor being connected to a gate terminal of said fourth transistor.

BRIEF DESCRIPTION OF THE DRAWINGS

Further characteristics and advantages of the invention will become apparent from the following detailed description of a preferred but not exclusive embodiment of the device according to the invention, illustrated only by way of non-limitative example in the accompanying drawings, wherein.

DESCRIPTION OF THE PREFERRED EMBODIMENTS

Figure 1:
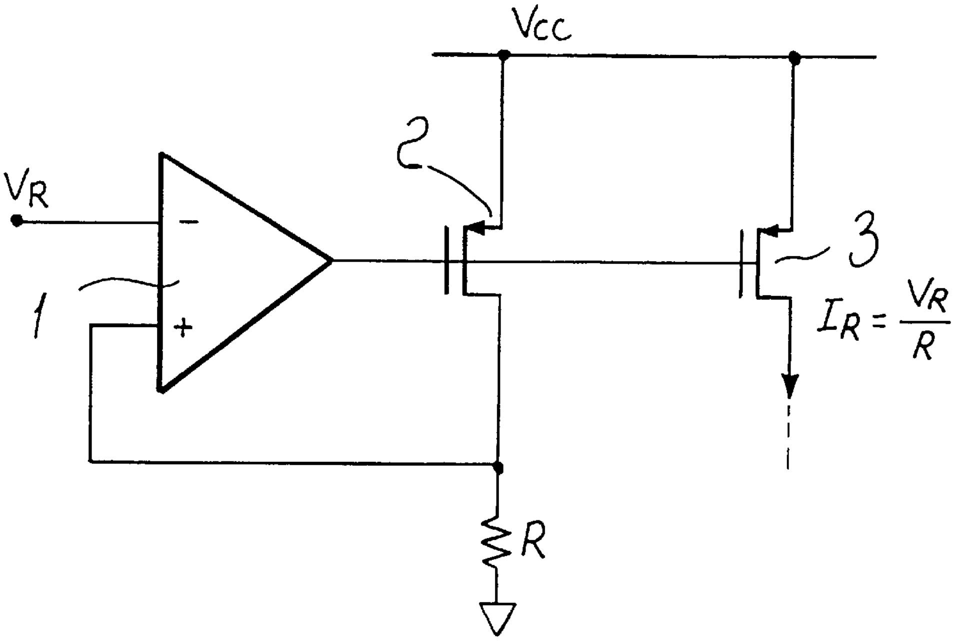
Fig.1 (PRIOR ART)
FIG. 1 is a circuit diagram of a conventional unbalanced-input voltage-current converter.
Figure 2:
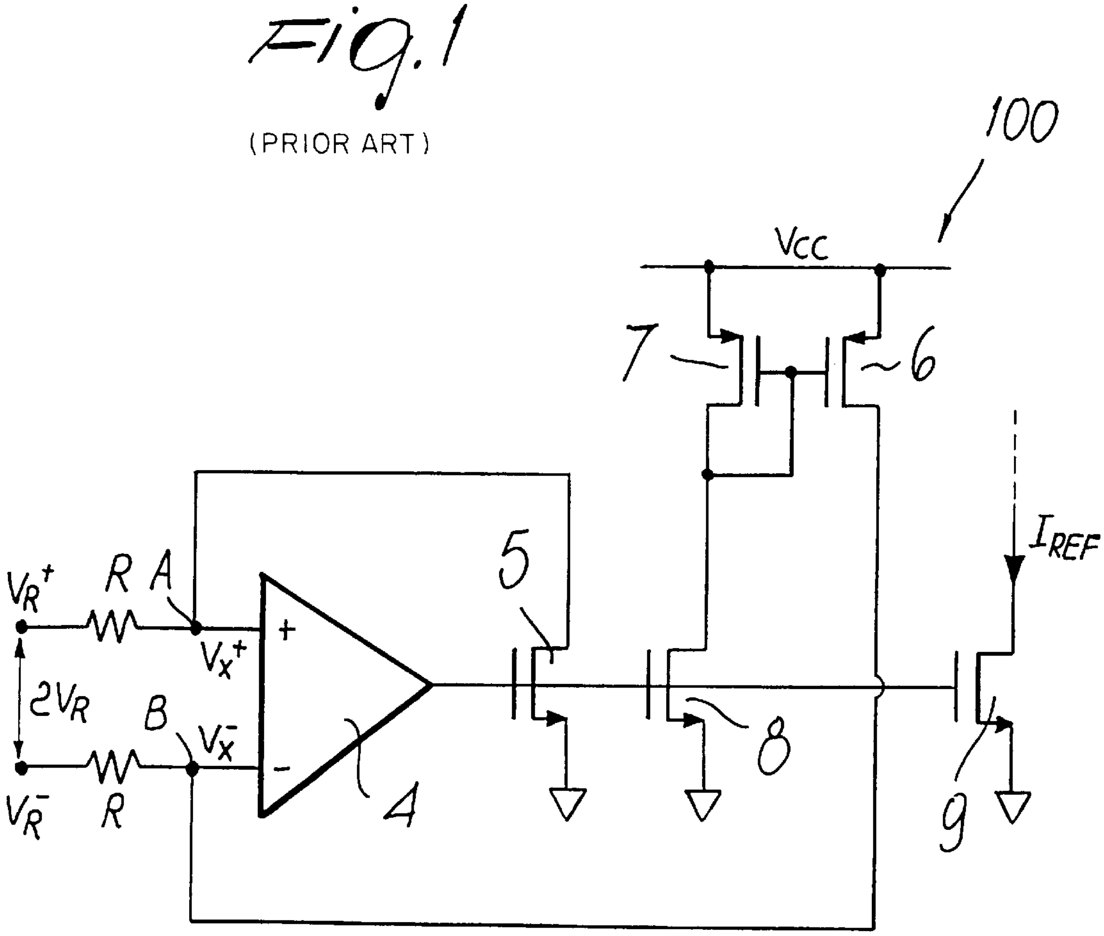
FIG. 2 is a circuit diagram of the voltage-current converter according to the present invention.

With reference to FIG. 2, the voltage-current converter according to the invention, generally designated by the reference numeral 100, comprises a differential operational amplifier 4, whose inputs receive a voltage to be converted into a current.

A differential input voltage, divided into components $V_R^-$ and $V_R^+$ arriving from a differential stage that precedes the converter and is not shown, is sent across a first resistor and a second resistor R to nodes A and B.

A first MOS transistor 5 of the N type is fedback between the output of the operational amplifier 4 and the noninverting input of said operational amplifier.

The MOS transistor 5 is connected to the output of the operational amplifier 4 by means of its gate terminal, to the ground by means of its source terminal, and to the noninverting input of the operational amplifier 4 by means of its drain terminal, forming the node A.

A second P-channel MOS transistor 6 is connected to the supply voltage $V_{cc}$ by means of its source terminal and to the inverting input of the operational amplifier 4 by means of its drain terminal, forming the node B.

A third MOS transistor 7 and a fourth MOS transistor 8, of the P-channel and N-channel types respectively, are connected between the supply voltage and ground. The gate terminal of the third transistor 7 is connected to the gate terminal of the transistor 6, while the gate terminal of transistor 8 is connected to the gate terminal of transistor 5.

The gate terminal of transistor 7 is connected to the gate terminal of transistor 6 and is also connected to the drain terminal of transistor 7.

Finally, a fifth N-channel MOS transistor 9 is connected to the gate terminal of transistor 8 by means of its gate terminal,and to ground by means of its source terminal. The current converted from the voltage in input to the differential amplifier 4 flows in the drain terminal of the transistor 9.

With reference to FIG. 2, the operation of the voltage-current converter according to the invention is as follows.

Since transistors 5 and 6 draw the same current, because transistors 7 and 8 force in transistor 6 the same current as transistor 5 and the nodes A and B are forced to be equal by the feedback, the voltage in A and B must be equal to:

$$V_X^- = V_X^+ = (V_R^+ + V_R^-)/2$$

Accordingly, the current that flows through transistor 5, designated by $I_5$ (not shown in the figure), is equal to:

$$I_5 = [V_R^+ - (V_R^+ + V_R^-)/2]/R$$

from which $$I_5 = (V_R^+ - V_R^-)/2 = 2V_R/2R = V_R/R$$

Likewise, the current in transistor 6, designated by $I_6$ (not shown in the figure), is equal to:

$$I_6=[(V_R^{+}+V_R^{-})/2-V_R^{-}]/R$$

from which $$I_6=(V_R^{+}-V_R^{-})/2R=2V_R/2R=V_R/R$$

The current $V_R/R$ is the current that flows through transistor 9.

A voltage-to-current conversion is thus provided with differential voltage inputs.

In practice it has been observed that the voltage-current converter according to the invention fully achieves the intended aim, since it allows to use a differential approach for voltage-current conversion, without altering the differentiality of the stage that precedes the converter, which supplies the differential voltage that is applied to the terminals of the operational amplifier that constitutes a part of the voltage-current converter.

The converter thus conceived is susceptible of numerous modifications and variations, all of which are within the scope of the inventive concept; all the details may also be replaced with other technically equivalent elements.

In practice, the materials employed, so long as they are compatible with the specific use, as well as the dimensions, may be any according to requirements and to the state of the art.

The disclosures in Italian Patent Application No. MI97A02278 from which this application claims priority are incorporated herein by reference.

What is claimed is:

1. A fully differential voltage-current converter, comprising a differential operational amplifier which is supplied with a differential voltage to be converted into a current, a first transistor being fedback to a noninverting input of the amplifier, a second transistor being fedback to an inverting input of the amplifier, said second transistor having the opposite polarity with respect to said first transistor, a third transistor and a fourth transistor having mutually opposite polarities being connected between a supply voltage and ground and to said second transistor in order to force a current that flows through said second transistor to be equal to a current that flows through said first transistor, a gate terminal of said first transistor being connected to a gate terminal of said fourth transistor.

2. The voltage-current converter of claim 1, wherein at the inputs of said differential amplifier a first resistor and a second resistor are provided across which said differential voltage to be converted into a current is applied.

3. The voltage-current converter of claim 1, further comprising a fifth transistor which is connected, by means of its gate terminal, to the gate terminal of said fourth transistor.

4. The voltage-current converter of claim 1, wherein in said first transistor the source terminal is connected to ground, the gate terminal is connected to the output of said differential operational amplifier, and the drain terminal is connected to the noninverting input of said differential operational amplifier.

5. The voltage-current converter of claim 1, wherein in said second transistor the source terminal is connected to the supply voltage, the gate terminal is connected to the gate terminal of said third transistor, and the drain terminal is connected to the inverting input of said differential operational amplifier.

6. The voltage-current converter of claim 1, wherein in said third transistor the source terminal is connected to the supply voltage, the drain terminal is connected to the drain terminal of said fourth transistor, and the gate terminal is connected both to the gate terminal of said second transistor and to the drain terminal of said third transistor.

7. The voltage-current converter of claim 3, wherein said first, fourth and fifth transistors are N-channel MOS transistors and in that said second and third transistors are P-channel MOS transistors.

* * * * *